United States Patent
Seok et al.

(10) Patent No.: US 10,312,059 B2
(45) Date of Patent: Jun. 4, 2019

(54) RING MEMBER WITH AIR HOLES AND SUBSTRATE PROCESSING SYSTEM INCLUDING THE SAME

(71) Applicant: Samsung Electronics Co., Ltd., Suwon-Si, Gyeonggi-do (KR)

(72) Inventors: Chulkyun Seok, Hwaseong-si (KR); Taekyun Kang, Hwaseong-si (KR); JungHwan Um, Seongnam-si (KR); Changwon Choi, Anyang-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 322 days.

(21) Appl. No.: 15/255,626

(22) Filed: Sep. 2, 2016

(65) Prior Publication Data
US 2017/0069471 A1    Mar. 9, 2017

(30) Foreign Application Priority Data
Sep. 4, 2015    (KR) .......................... 10-2015-0125718

(51) Int. Cl.
*H01L 21/31*    (2006.01)
*H01J 37/32*    (2006.01)

(52) U.S. Cl.
CPC .... *H01J 37/32642* (2013.01); *H01J 37/3244* (2013.01); *H01J 37/32082* (2013.01); *H01J 37/32477* (2013.01); *H01J 37/32697* (2013.01); *H01J 37/32715* (2013.01)

(58) Field of Classification Search
CPC .................. H01L 37/32623; H01L 37/32082
See application file for complete search history.

(56) References Cited

U.S. PATENT DOCUMENTS

| | | | |
|---|---|---|---|
| 4,665,463 A | 5/1987 | Ward et al. | |
| 5,382,311 A | 1/1995 | Ishikawa et al. | |
| 5,631,803 A | 5/1997 | Cameron et al. | |
| 6,063,202 A | 5/2000 | Cleary et al. | |
| 6,603,650 B1 | 8/2003 | Divakar et al. | |
| 7,156,950 B2 | 1/2007 | Kim et al. | |
| 7,601,224 B2 | 10/2009 | Foree | |
| 7,988,814 B2* | 8/2011 | Koshiishi | H01J 37/32642 118/723 E |
| 2007/0187363 A1 | 8/2007 | Oka et al. | |
| 2008/0149596 A1* | 6/2008 | Dhindsa | H01J 37/3244 216/67 |

(Continued)

FOREIGN PATENT DOCUMENTS

| | | |
|---|---|---|
| JP | 2004-022988 A | 1/2004 |
| JP | 2007-243138 A | 9/2007 |

(Continued)

*Primary Examiner* — Robert M Kunemund
(74) *Attorney, Agent, or Firm* — Lee & Morse, P.C.

(57) ABSTRACT

A substrate processing system includes a wall liner, an electrostatic chuck in the wall liner to hold a substrate, and a ring member including a focus ring and a side ring. The focus ring is on an edge region of the electrostatic chuck and the side ring encloses an outer side surface of the focus ring and a side surface of the electrostatic chuck. The side ring includes air holes extending from a bottom surface of the ring member towards a top portion of the ring member and extending from the top portion of the ring member towards an outer side surface of the ring member.

20 Claims, 8 Drawing Sheets

(56) References Cited

U.S. PATENT DOCUMENTS

| | | | |
|---|---|---|---|
| 2011/0272100 A1* | 11/2011 | Koshiishi | H01J 37/32623 156/345.43 |
| 2012/0160418 A1* | 6/2012 | Hanaoka | H01J 37/32082 156/345.38 |
| 2013/0230972 A1* | 9/2013 | Johnson | H01L 21/3065 438/464 |
| 2014/0116622 A1 | 5/2014 | Lee | |

FOREIGN PATENT DOCUMENTS

| | | |
|---|---|---|
| KR | 10-0459748 B1 | 12/2004 |
| KR | 10-2011-0089692 A | 8/2011 |
| KR | 10-2014-0055899 A | 5/2014 |

* cited by examiner

RING MEMBER WITH AIR HOLES AND SUBSTRATE PROCESSING SYSTEM INCLUDING THE SAME

CROSS-REFERENCE TO RELATED APPLICATION

Korean Patent Application No. 10-2015-0125718, filed on Sep. 4, 2015, and entitled, "Ring Member with Air Holes and Substrate Processing System Including the Same," is incorporated by reference herein in its entirety.

BACKGROUND

1. Field

One or more embodiments described herein relate to a ring member with air holes and a substrate processing system including a ring member with air holes.

2. Description of the Related Art

Semiconductor devices are usually manufactured using a plurality of unit processes. Examples of these processes include a thin-film deposition process, a diffusion process, an annealing process, a photolithography process, a polishing process, an etching process, an ion implantation process, and a cleaning process.

Etching may be performed by a dry etching process or a wet etching process. In most dry etching processes, plasma generated from a reaction gas is used to etch a substrate or a layer thereon. The reaction gas may flow from a center region of the substrate toward an edge direction. However, there may a difference in fluid speed of the reaction gas between the center and edge regions of the substrate. This difference may lead to process failures that adversely affect the quality of the finished device.

SUMMARY

In accordance with one or more embodiments, a substrate processing system includes a wall liner; an electrostatic chuck in the wall liner to hold a substrate; and a ring member including a focus ring and a side ring, the focus ring on an edge region of the electrostatic chuck and the side ring enclosing an outer side surface of the focus ring and a side surface of the electrostatic chuck, the side ring including air holes extending from a bottom surface of the ring member towards a top portion of the ring member and extending from the top portion of the ring member towards an outer side surface of the ring member.

The side ring may include a ground ring enclosing the side surface of the electrostatic chuck; and a cover ring on the ground ring to enclose the outer side surface of the focus ring, wherein the air holes extend from a bottom surface of the ground ring to an outer side surface of the cover ring. The air holes may include a plurality of first air holes in the ground ring; and plurality of second air holes in the cover ring and connected to the first air holes.

The wall liner may include an exhausting hole through a bottom portion of the wall liner adjacent to the electrostatic chuck, and a density of the first air holes may increase with decreasing distance from the exhausting hole. The second air holes may include a plurality of first air line holes aligned with the first air holes; and a first air gap nozzle connected to the first air line holes and extending towards the outer side surface of the cover ring.

The ring member may include a plurality of sectors connected to an upper corner of the side ring. Each of the sectors may include an axis on the upper corner of the side ring; and a blade coupled to the axis to control an open/close state of the air hole. The side ring may include a first side ring enclosing the outer side surface of the focus ring and the side surface of the electrostatic chuck; and a second side ring enclosing an outer side surface of the first side ring and defining the air holes.

Each of the air holes may include a second air line hole extending from a bottom surface of the second side ring toward a top portion of the second side ring; and a second air gap nozzle connected to the second air line hole to extend toward an outer side surface of the second side ring. A non-reaction gas supplying part may be connected to a bottom portion of the wall liner to supply a non-reaction gas to the air hole.

In accordance with one or more other embodiments, a substrate processing system with an air hole includes a chamber including a lower housing and an upper housing; an electrostatic chuck in the lower housing to hold a substrate; and a ring structure to enclose a side surface of the electrostatic chuck, wherein the ring structure includes an air hole extending from a bottom to a top of the ring structure and from the top to an outer side surface of the ring structure.

The ring structure may include a focus ring on an edge region of the electrostatic chuck; and a side ring enclosing an outer side surface of the focus ring and a side surface of the electrostatic chuck and having the air hole. The side ring may include a ground ring enclosing the side surface of the electrostatic chuck; and a cover ring on the ground ring to enclose the outer side surface of the focus ring, wherein the air hole includes: an air line hole in the ground ring; and an air gap nozzle connected to the air line hole and in an outer side surface of the cover ring.

The ring structure may include a plurality of sectors on an upper corner of the side ring, each of the sectors including: an axis on the upper corner of the side ring; and a blade connected to the axis to control an open/close state of the air hole. The side ring may include a first side ring enclosing the outer side surface of the focus ring and the side surface of the electrostatic chuck; and a second side ring enclosing an outer side surface of the first side ring and having the air hole.

In accordance with one or more other embodiments, an apparatus includes a focus ring on an edge region of an object; and a side ring enclosing an outer side surface of the focus ring and a side surface of the object below the focus ring, the side ring having an air hole including: a lower region upwardly extending through a bottom surface of the side ring, and an upper region inwardly extending through an outer side surface thereof, the lower and upper regions connected to each other in a top portion of the side ring.

The side ring may include a ground ring enclosing a side surface of the object; and a cover ring on the ground ring to enclose the focus ring, and the air hole extends through the side ring to connect a bottom surface of the ground ring to an outer side surface of the cover ring. The air hole may include an air gap nozzle in the outer side surface of the cover ring.

The apparatus may include a plurality of sectors connected to an upper corner of the side ring, wherein each of the sectors includes: an axis on the upper corner of the side ring; and a blade coupled to the axis to control an open/close state of the air hole. The side ring may include a first side ring enclosing the outer side surface of the focus ring and the side surface of the electrostatic chuck; and a second side ring enclosing an outer side surface of the first side ring and defining the air holes.

In accordance with one or more other embodiments, a substrate processing system includes a chamber; an electrostatic chuck in the chamber to hold a substrate; and a ring member on an edge region and a side surface of the electrostatic chuck, wherein the ring member includes: a focus ring on the edge region of the electrostatic chuck, and a side ring enclosing an outer side surface of the focus ring and the side surface of the electrostatic chuck, and an air nozzle passing through an outer side surface of the ring member.

The side ring may include a ground ring enclosing the side surface of the electrostatic chuck; and a cover ring on the ground ring to enclose the outer side surface of the focus ring, the air nozzle is provided in the cover ring. The system may include a non-reaction gas supplying part connected to the chamber to supply a non-reaction gas to the air nozzle, wherein the ground ring includes a plurality of first air line holes to provide the non-reaction gas into a region between the air nozzle and the chamber.

The system may include a wall liner between the ground ring and the chamber to enclose the electrostatic chuck, wherein the first air line holes are connected to holes penetrating the wall liner. The wall liner may have an exhausting hole adjacent to the electrostatic chuck, and a density of the first air line holes increases with decreasing distance from the exhausting hole.

The ring member may include a plurality of sectors connected to an upper corner of the side ring. Each of the sectors may include an axis on the upper corner of the side ring; and a blade coupled to the axis to control an open/close state of the air nozzle. The side ring may include a first side ring enclosing an outer side surface of the focus ring and the side surface of the electrostatic chuck; and second side ring enclosing an outer side surface of the first side ring, wherein the air nozzle is in the second side ring. The second side ring may include a plurality of second air line holes extending from the air nozzle to a bottom surface of the side ring.

In accordance with one or more other embodiments, an apparatus includes a ring adjacent to an electrostatic chuck; and at least one passageway extending through or along the ring to discharge a flow of first gas, wherein the first gas discharged from the at least one passageway is to generate an air cushion substantially level with a support surface of the electrostatic chuck, the air cushion extending flow of a second gas in a radial direction from a center of the electrostatic chuck. The at least one passageway is to change a direction of the flow of the first gas from a first direction to the radial direction.

Flow of the second gas may extend beyond an edge of the electrostatic chuck by a distance that is based on a discharge rate of the first gas discharged from the passageway in the radial direction. A plurality of passageways may extend through or along the ring, each of the passageways to discharge a flow of the first gas to form the air cushion. The first gas may be a non-reaction gas and the second gas may be a reaction gas of a semiconductor fabrication process.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
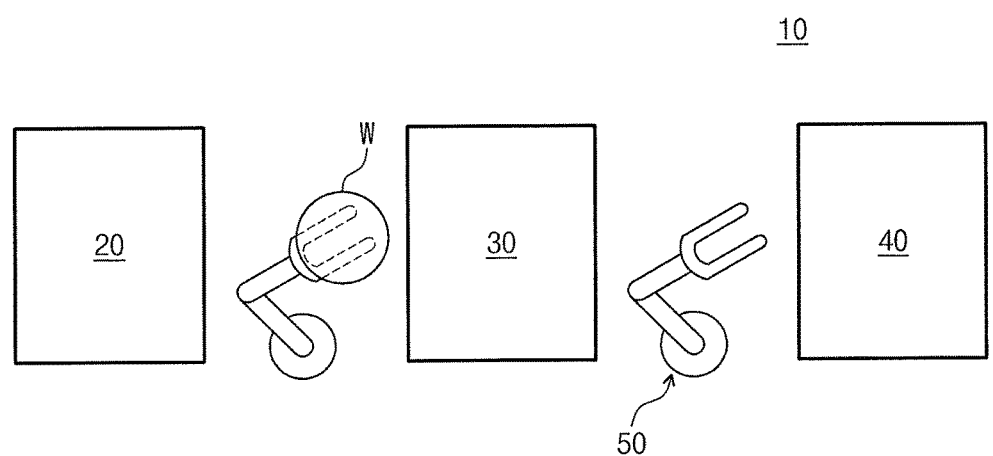
FIG. 1 illustrates an embodiment of a system for fabricating a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning consistent with their meaning in the context of the relevant art and will not be interpreted in an idealized or overly formal sense unless expressly defined herein.

FIG. 1 illustrates an embodiment of a semiconductor fabricating system 10 which may be configured to perform at least one unit process on a substrate W. The unit process may be, for example, a deposition process, a lithography process, an etching process, a diffusion process, a thermal treatment process, a polishing process, an ion implantation process, a cleaning process, or an ashing process.

The semiconductor fabrication system 10 may include a deposition system 20, a photolithography system 30, an etching system 40, and transferring devices 50. The deposition system 20 may be configured to perform a deposition process. For example, the deposition system 20 may be used to deposit a thin layer on the substrate W. The substrate W may be or include a semiconductor wafer. In one embodiment, the substrate W may be or include a transparent (e.g., glass or plastic) substrate.

The photolithography system 30 may perform a lithography process on a photoresist layer. For example, the photolithography system 30 may be used to form a mask pattern on the substrate W. The etching system 40 may perform an etching process. For example, the etching system 40 may be used to etch the substrate W and/or the thin layer exposed by a mask pattern. Each of the transferring devices 50 may transfer the substrate W. For example, each of the transferring devices 50 may be between the deposition system 20 and the photolithography system 30 or between the photolithography system 30 and the etching system 40.

In exemplary embodiments, the deposition system 20, the photolithography system 30, the etching system 40, and the transferring devices 50 may be arranged in a line. The semiconductor fabrication system 10 may sequentially perform a plurality of unit processes on the substrate W. In certain embodiments, the deposition system 20, the photolithography system 30, the etching system 40, and the transferring devices 50 may be connected to each other to form a cluster-type system.

In exemplary embodiments, the deposition system 20 and the etching system 40 may process the substrate W using plasma reaction. For example, the deposition system 20 may be one of a chemical vapor deposition system or a sputtering system. The etching system 40 may be one of an inductively-coupled plasma (ICP) etching system or a capacitively-coupled plasma (CCP) etching system.

An example of the etching system 40 will be described. Also, in one embodiment, the following technology embedded in the etching system 40 may be similarly deployed in the deposition system 20.

Figure 2:
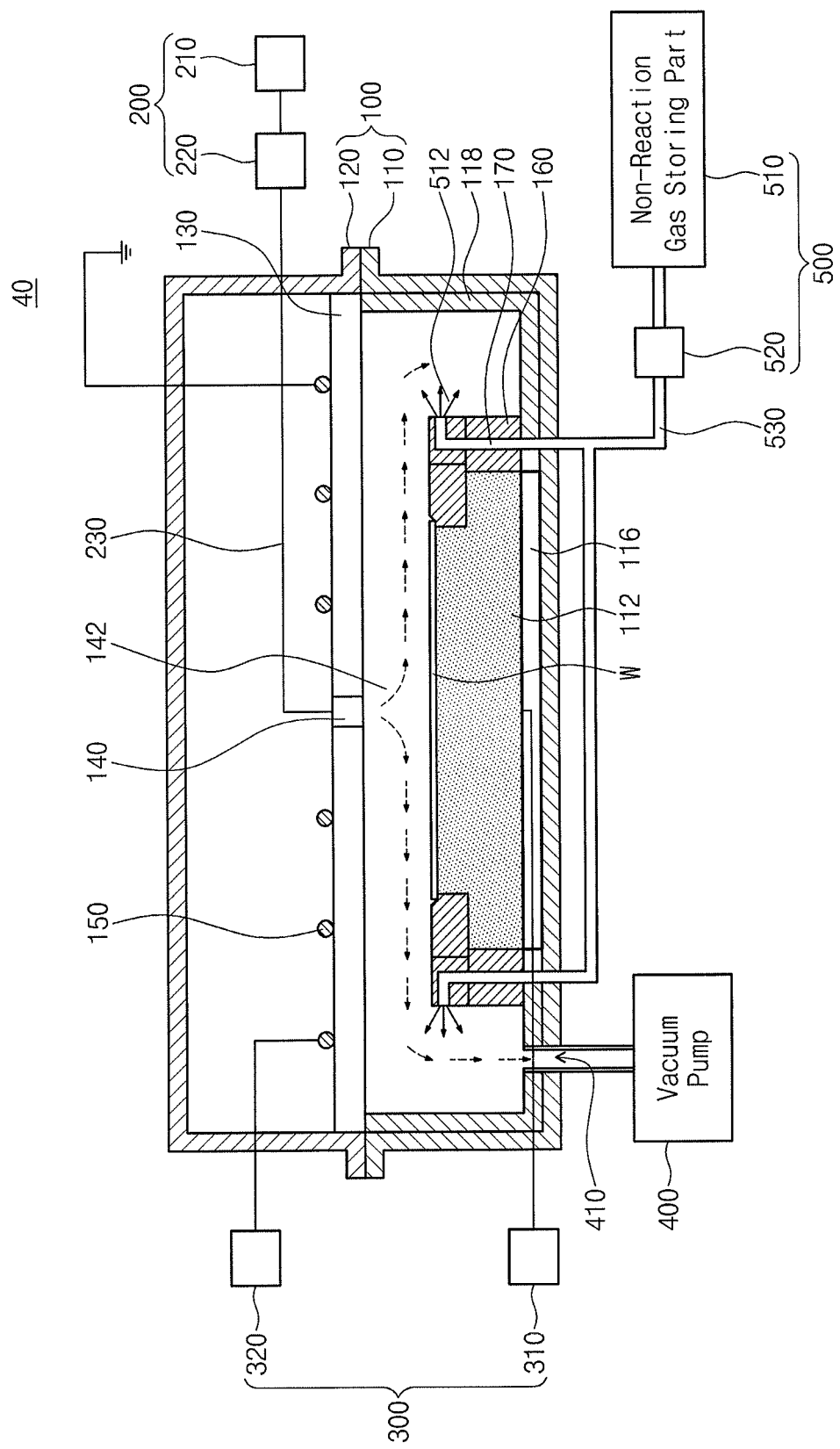
FIG. 2 illustrates an embodiment of an etching system.

FIG. 2 is a sectional view illustrating an embodiment of the etching system 40 in FIG. 1. Referring to FIG. 2, the etching system 40 may include a chamber 100, a reaction gas supplying part 200, a radio frequency (RF) power supplying part 300, a pumping part 400, and a non-reaction gas supplying part 500. A substrate W may be in the chamber 100.

The reaction gas supplying part 200 may supply a reaction gas 142 into the chamber 100 or on the substrate W. The reaction gas 142 may include an etching gas, e.g., hydrofluoric acid (HF) or sulfur hexafluoride (SF6). The RF power supplying part 300 may provide high-frequency (e.g., radio frequency (RF)) power to the chamber 100. The RF power may induce a plasma reaction from the reaction gas 142. The substrate W or a layer thereon may be etched by the reaction gas 142 or the plasma reaction thereof.

The pumping unit 400 may pump out air from the chamber 100. The non-reaction gas supplying part 500 may supply a non-reaction gas 512 into the chamber 100. The non-reaction gas 512 may be supplied to a region of the chamber 100 adjacent to an edge of the substrate W. The non-reaction gas 512 may allow the reaction gas 142 to flow toward an inner side surface of the chamber 100 beyond the edge of the substrate W. The non-reaction gas 512 may include at least one of helium (He), argon (Ar), nitrogen (N2), or oxygen (O2). In one embodiment, the non-reaction gas 512 may include substantially the same material as the reaction gas 142.

The chamber 100 may provide room for isolating the substrate W from the outer space. In exemplary embodiments, the chamber 100 may include a lower housing 110 and an upper housing 120. The lower housing 110 may be below the substrate W. The upper housing 120 may be on the substrate W and the lower housing 110. When the unit process is performed on the substrate disposed on the lower housing 110, the lower and upper housings 110 and 120 may be coupled to each other to hermetically seal the chamber 100. When the unit process is finished, the lower and upper housings 110 and 120 may be vertically separated from each other to load or unload the substrate W on or from the lower housing 110.

The reaction gas supplying part 200 may be connected to the upper housing 120. The reaction gas supplying part 200 may include a reaction gas storing part 210 and a first mass-flow control valve 220. The reaction gas storing part 210 may store the reaction gas 142. The first mass-flow control valve 220 may be provided on a reaction gas supplying line 230 connecting the reaction gas storing part 210 to the upper housing 120. The first mass-flow control valve 220 may adjust the flow rate of the reaction gas 142 supplied into the chamber 100. For example, the reaction gas may include at least one of strongly acidic gases (e.g., SF6, HF, CF, or CH3).

The RF power supplying part 300 may be connected to the lower housing 110 and the upper housing 120. The RF power supplying part 300 may include a first RF power supplying part 310 and a second RF power supplying part 320. The first RF power supplying part 310 may supply a first RF power to the lower housing 110. The second RF power supplying part 320 may supply a second RF power to the upper housing 120.

The pumping part 400 may be connected to the lower housing 110. The pumping part 400 may exhaust the reaction gas and the non-reaction gas through an exhausting hole 410 penetrating the lower housing 110 and a wall liner 118. For example, the pumping part 400 may include a vacuum pump. The pumping unit 400 may reduce internal pressure of the chamber 100. For example, the pumping unit 400 may reduce internal pressure of the chamber 100 to about 1 mTorr to 10 mTorr.

The non-reaction gas supplying part 500 may be connected to the lower housing 110. In exemplary embodiments, the non-reaction gas supplying part 500 may include a non-reaction gas storing part 510 and a second mass-flow control valve 520. The non-reaction gas storing part 510 may store the non-reaction gas 512. The second mass-flow control valve 520 may be on a second supplying line 530 connecting the non-reaction gas storing part 510 to the lower housing 110. The second mass-flow control valve 520 may be used to adjust the flow rate of the non-reaction gas 512 supplied into the chamber 100. The non-reaction gas 512 may include, for example, at least one of helium (He), nitrogen (N2), or argon (Ar).

Referring again to FIG. 2, the substrate W may be on an electrostatic chuck 112 of the chamber 100. The electrostatic chuck 112 may be provided in the lower housing 110 to hold the substrate W using electrostatic force.

Ring members 160 may be on side and edge regions of the electrostatic chuck 112. The ring members 160 may enclose an outer side surface of the substrate W. In exemplary embodiments, the ring members 160 may have air holes 170 that penetrate a bottom portion of the lower housing 110 and extend along a side surface of the electrostatic chuck 112. The air holes 170 may discharge the non-reaction gas 512 from side surfaces of the ring members 160 toward an inner side wall of the wall liner 118.

A lower electrode 116 may be in the lower housing 110 or below the electrostatic chuck 112. The first RF power transmitted from the first RF power supplying unit 310 may be applied to the lower electrode 116. The reaction gas 142 may be concentrated on the substrate W by the first RF power. The first RF power may allow the reaction gas 142 to be moved with a high straightness, e.g., in a particular direction in a concentrated manner. Use of the first RF power may make it possible to improve etching anisotropy in the etching process.

The wall liner 118 may enclose the electrostatic chuck 112 and the lower electrode 116. The wall liner 118 may be in the lower housing 110. The ring members 160 may be on the wall liner 118. The air holes 170 may extend from the lower housing 110 to the ring members 160. The second supplying line 530 may be connected to air holes 170.

A window 130 may be in the upper housing 120 or on the electrostatic chuck 112 and the wall liner 118. The window 130 may be formed of or include at least one dielectric ceramic material, e.g., aluminum oxide (Al$_2$O$_3$).

A reaction gas nozzle 140 may be in the upper housing 120 and on the electrostatic chuck 112 and the substrate W. The reaction gas nozzle 140 may be connected to the reaction gas supplying part 200. The reaction gas nozzle 140 may supply the reaction gas 142 on the substrate W. The reaction gas nozzle 140 may pass through the window 130 and may have an end portion facing a center region of the substrate W. The reaction gas nozzle 140 may spray reaction gas 142 onto a top surface of the substrate W.

Antenna electrodes 150 may be disposed in the upper housing 120 and on the window 130. The antenna electrodes 150 may be connected to the second RF power supplying part 320. The second RF power may be applied to the antenna electrodes 150. The second RF power may be used to induce a plasma reaction from the reaction gas 142. The window 130 may electrically separate the antenna electrodes 150 from the plasma reaction. The plasma reaction may be controlled by adjusting the intensity of the second RF power.

Figure 3:
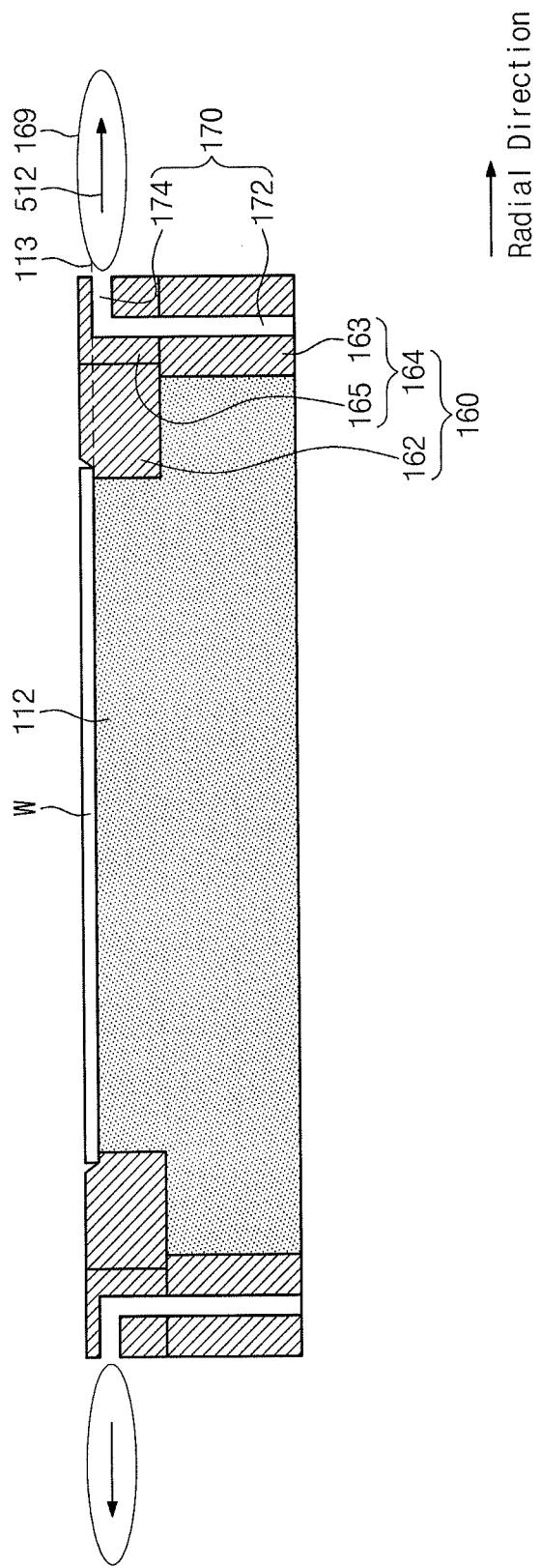
FIG. 3 illustrates an embodiment of a ring member.

FIG. 3 is a sectional view illustrating an embodiment of the ring member 160 in FIG. 2. Referring to FIG. 3, the ring member 160 may include a focus ring 162 and a first side ring 164. The focus ring 162 may be on an edge region of the electrostatic chuck 112. For example, the focus ring 162 may be an edge ring. The first side ring 164 may be below the focus ring 162. The first side ring 164 may enclose the side surface of the electrostatic chuck 112. In exemplary embodiments, the first side ring 164 may be provided to define the air holes 170. In exemplary embodiments, the air holes 170 may extend from the bottom surface of the first side ring 164 to a level 113 of the top surface of the electrostatic chuck 112, in a direction parallel to the side surface of the electrostatic chuck 112. Furthermore, the air holes 170 may extend parallel to the top surface of electrostatic chuck 112 and penetrate the side surface of first side ring 164.

The first side ring 164 may include a ground ring 163 and a cover ring 165. The ground ring 163 may enclose the side surface of the electrostatic chuck 112. The cover ring 165 may be disposed on the ground ring 163.

Each of the air holes 170 may penetrate not only the ground ring 163 but also the cover ring 165. In exemplary embodiments, the air holes 170 may include first air holes 172 and second air holes 174. The first air holes 172 may be in the ground ring 163 and may extend from a bottom surface of the ground ring 163 to a top surface of the ground ring 163. The first air holes 172 may be parallel to the side surface of the electrostatic chuck 112 and may be formed in the ground ring 163 to serve as a lower line hole. The second air holes 174 may be in the cover ring 165 and may extend parallel to the top surface of the electrostatic chuck 112 and penetrate an outer side surface of the cover ring 165 (for example, at the level 113). Air flow from holes 174 may therefore be in a radial direction as shown by the arrow in FIG. 3.

Figure 4:
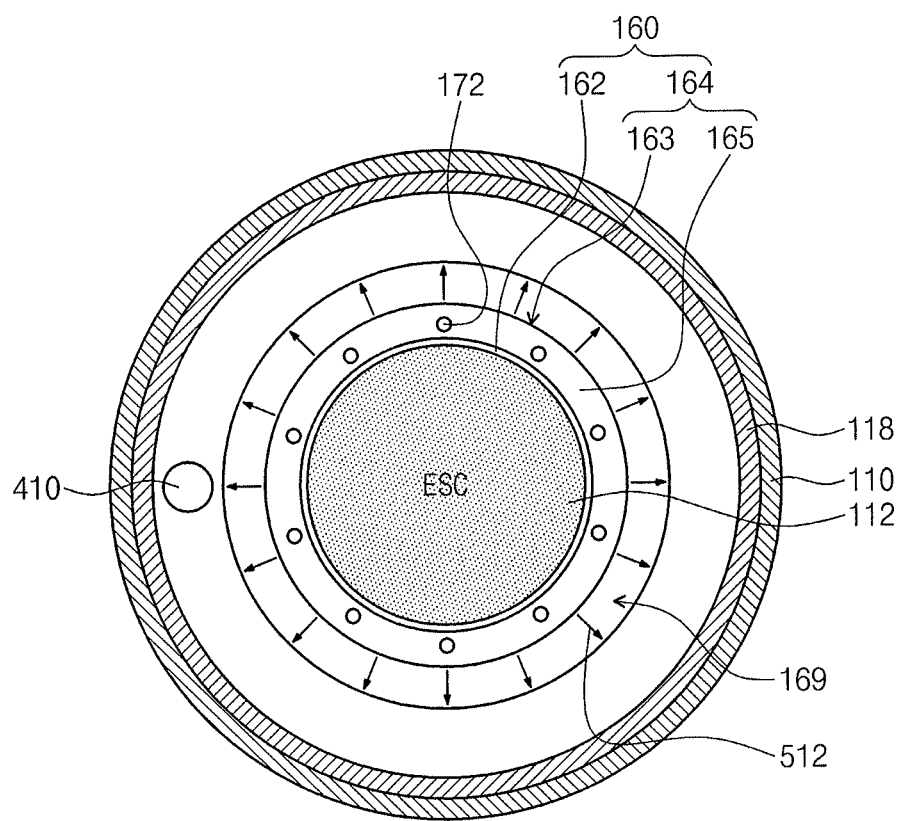
FIG. 4 illustrates an embodiment which includes an electrostatic chuck, a ring member, a wall liner, and a lower housing.

FIG. 4 illustrates an embodiment of the electrostatic chuck 112, the ring member 160, the wall liner 118, and the lower housing 110 in FIG. 2. Referring to FIGS. 2 through 4, the second air holes 174 may be formed along an edge of the cover ring 165 and along an outer circumference surface of the cover ring 165. The second air holes 174 may discharge the non-reaction gas 512 in a direction from the cover ring 165 toward the wall liner 118. The discharge of the non-reaction gas 512 may allow an air cushion region 169 to be formed along an outer circumference of the cover ring 165. The air cushion region 169 may be outside the ring member 160. For example, the air cushion region 169 may be a region of the chamber 100 positioned outside the substrate W and the ring member 160.

The air cushion region 169 may be formed at substantially the same level as the substrate W and ring member 160. The formation of the air cushion region 169 may allow reaction gas 142 to flow at substantially the same level as that on the substrate W. The reaction gas 142 may flow toward the exhausting hole 410 of the wall liner 118, at a region beyond the air cushion region 169. The flow speed of the reaction gas 142 may be rapidly changed near the edge region of the substrate W.

For example, without the air cushion region 169, the downward speed of the reaction gas 142 may rapidly increase near the edge region of the substrate W. However, the presence of the air cushion region 169 may suppress such an increase in the downward speed of the reaction gas 142. In one embodiment, the reaction gas 142 may flow at a substantially uniform speed on the substrate W and the ring member 160. The air cushion region 169 may reduce the difference in flow speed of the reaction gas 142 between the center and edge regions of the substrate W. This may contribute to suppress etching failures in the etching process.

The flow speed of the reaction gas 142 may increase with decreasing distance from the exhausting hole 410. In exemplary embodiments, the number or density of the first air holes 172 may change depending on distance from the exhausting hole 410. For example, the smaller the distance from the exhausting hole 410, the greater the density of the first air holes 172. Such a change in the number or density of the first air holes 172 may make it possible to realize a spatial variation in the supply amount of the reaction gas 142, and may consequently reduce the difference in width of the air cushion region 169 along the ring member 160.

Figure 5:
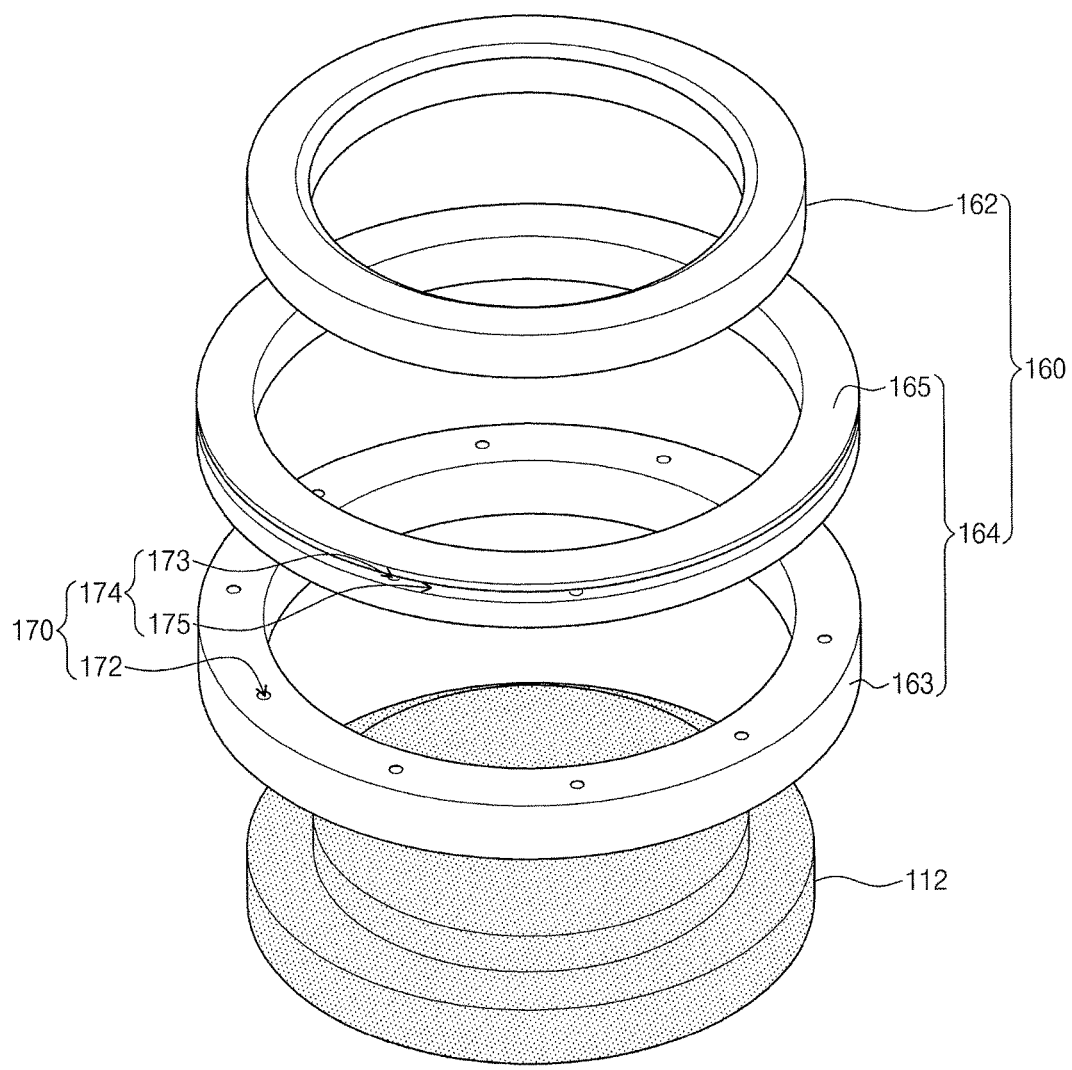
FIG. 5 illustrates an exploded view of the electrostatic chuck and ring member.

FIG. 5 is an exploded perspective view illustrating an embodiment of the electrostatic chuck 112 and the ring member 160 in FIG. 3. Referring to FIG. 5, the second air holes 174 may include first air line holes 173 and a first air gap nozzle 175. The first air line holes 173 may be aligned with the first air holes 172. The first air gap nozzle 175 may be connected to the first air holes 172 through the first air line holes 173. The first air gap nozzle 175 may extend along the outer side surface of the cover ring 165.

Figure 6:
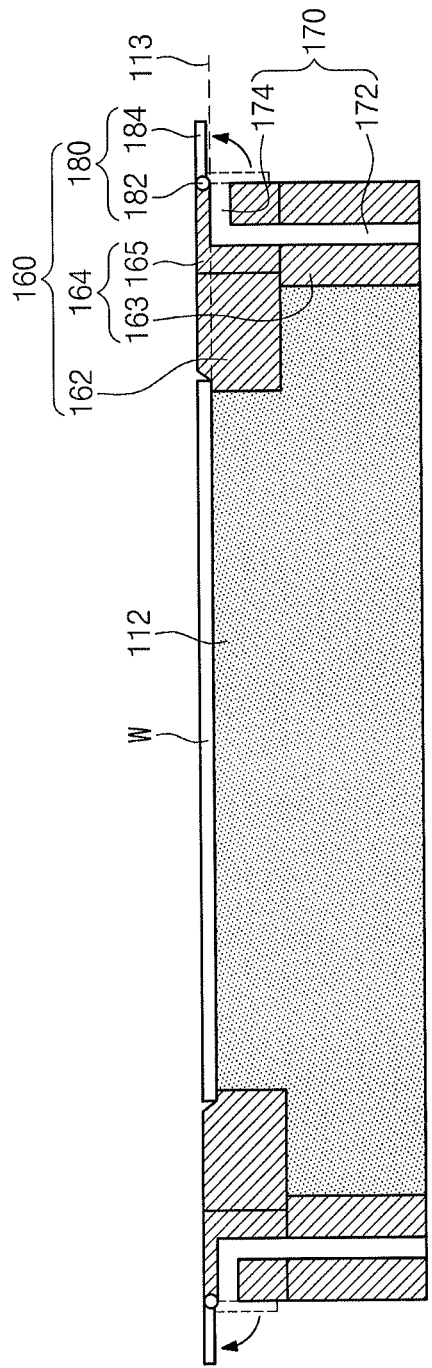
FIG. 6 illustrates another embodiment of a ring member.

FIG. 6 is a sectional view illustrating another embodiment of the ring member 160 of FIG. 2. Referring to FIG. 6, the ring member 160 may include a plurality of sectors 180. Each sector 180 may be connected to an upper corner of the cover ring 165. In exemplary embodiments, each sector 180 may include an axis 182 and a blade 184. The axis 182 may be at and face a portion of the upper corner of the cover ring 165. The blades 184 may be connected to and rotate about the axis 182 to thereby veil the second air holes 174. In exemplary embodiments, the blades 184 may rotate based on flow of the non-reaction gas 512 and be discharged from the second air holes 174. For example, the axis 182 may include, for example, a ring wire around the cover ring 165. The blades 184 may include a plurality of ring sectors.

Figure 7:
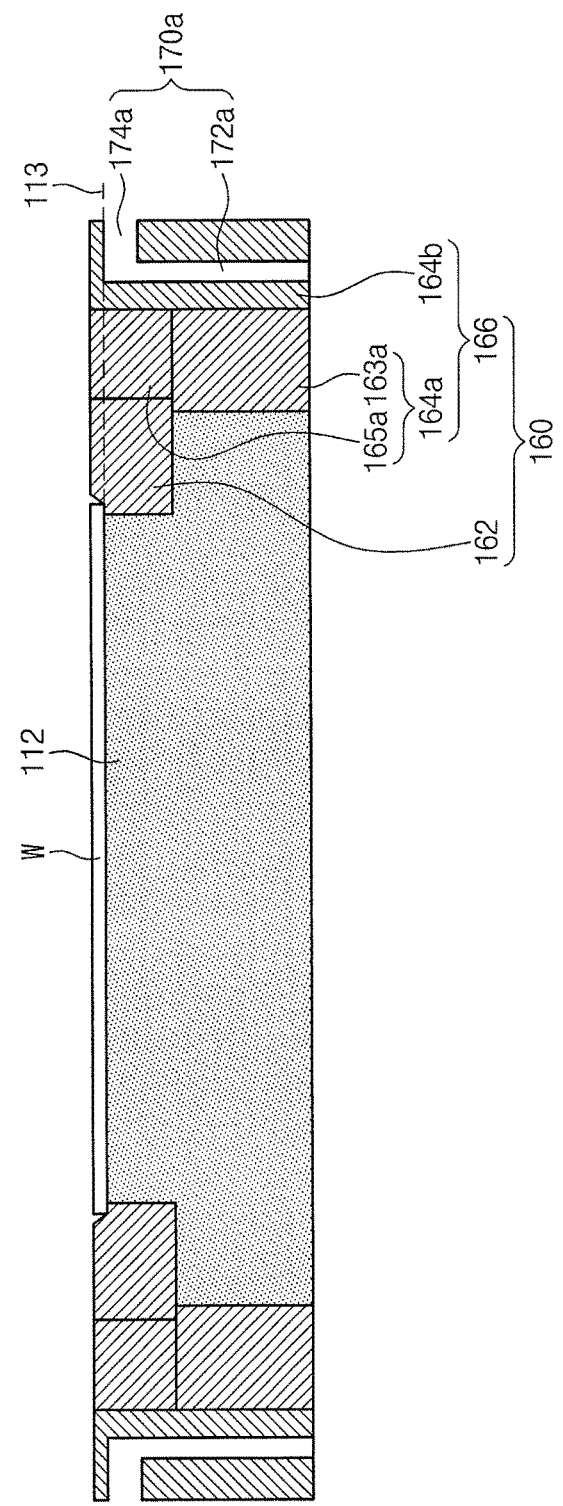
FIG. 7 illustrates another embodiment of a ring member.

FIG. 7 is a sectional view illustrating another embodiment of the ring member 160 in FIG. 2. Referring to FIG. 7, the ring member 160 may include a side ring 166 with a first side ring 164a and a second side ring 164b. The first side ring 164a may enclose the focus ring 162 and the electrostatic chuck 112. The second side ring 164b may enclose the outer side surface of the first side ring 164a.

The first side ring 164a may include the ground ring 163a and the cover ring 165a. The ground ring 163a may enclose the side surface of the electrostatic chuck 112. The cover ring 165a may be disposed on the ground ring 163. The cover ring 165a may enclose the outer side surface of the focus ring 162.

The second side ring 164b may be provided to define air holes 170a. Each air hole 170a may extend from a bottom surface of the second side ring 164b to a level 113 of the top surface of the electrostatic chuck 112, in a direction parallel to the side surface of the electrostatic chuck 112. Furthermore, each air hole 170a may extend parallel to the top surface of the electrostatic chuck 112 and penetrate the outer side surface of the second side ring 164b.

Figure 8:
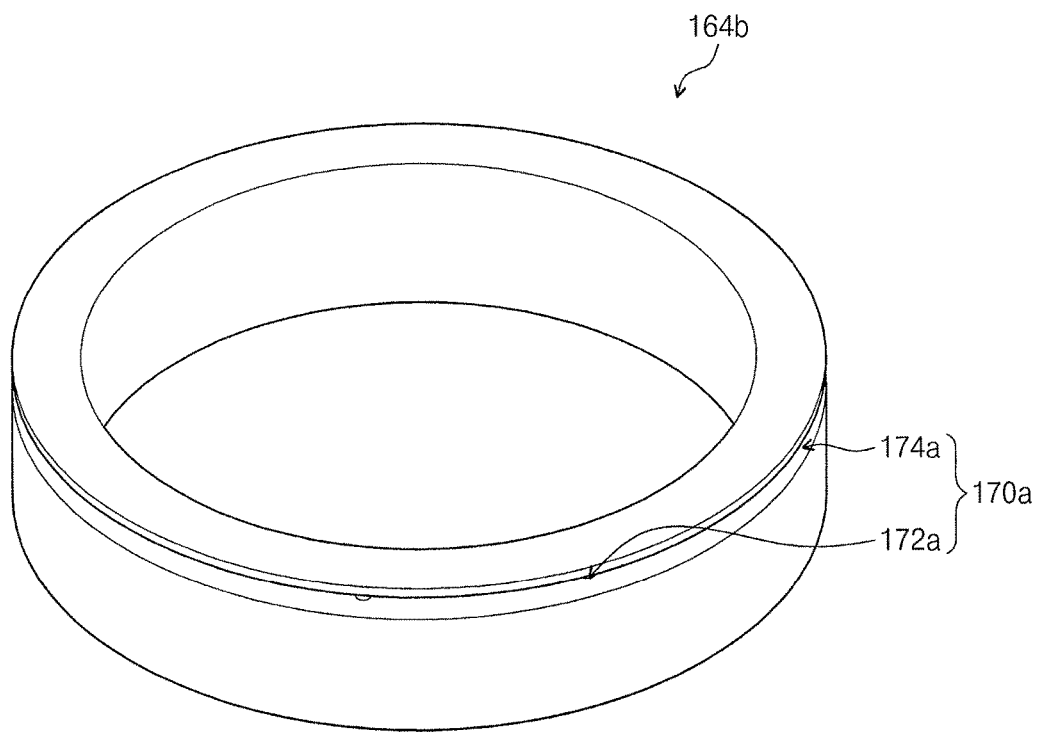
FIG. 8 illustrates an embodiment of a second side ring.

FIG. 8 is a sectional view illustrating an embodiment of the second side ring 164b in FIG. 7. Referring back to FIGS. 7 and 8, the air holes 170a may include second air line holes 172a and a second air gap nozzle 174a. The second air line holes 172a may extend from a bottom surface of the second side ring 164b to a level 113 of the top surface of the electrostatic chuck 112, in a direction parallel to the side surface of the electrostatic chuck 112. The second air gap nozzle 174a may be connected to the top entrances of the second air line holes 172a. Furthermore, the second air gap nozzle 174a may extend parallel to the top surface of the electrostatic chuck 112 and penetrate the outer side surface of the second side ring 164b. The non-reaction gas 512 may be discharged from the outer side surface of the second side ring 164b through the second air gap nozzle 174a.

In accordance with one or more of the aforementioned embodiments, a substrate processing system includes a ring member with an air nozzle to allow an air cushion region to be formed at substantially the same level as a top surface of an electrostatic chuck. The formation of the air cushion region may make it possible to reduce the difference in flow speed of a reaction gas between center and edge regions of a substrate. Accordingly, it may be possible to prevent process failures caused by such a difference during a substrate processing process. In one or more embodiments, the holes and/or nozzles may be considered to form passageways for carrying and/or discharging gas. Also, in one or more embodiments, the rings may be considered to form one ring with different parts.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments in the claims.

What is claimed is:

1. A substrate processing system, comprising:
   a wall liner;
   an electrostatic chuck in the wall liner to hold a substrate; and
   a ring member including a focus ring and a side ring, the focus ring on an edge region of the electrostatic chuck and the side ring enclosing an outer side surface of the focus ring and a side surface of the electrostatic chuck, wherein the side ring includes air holes extending from a bottom surface of the ring member towards a top portion of the ring member and extending from the top portion of the ring member towards an outer side surface of the ring member.

2. The system as claimed in claim 1, wherein the side ring includes:
   a ground ring enclosing the side surface of the electrostatic chuck; and
   a cover ring on the ground ring to enclose the outer side surface of the focus ring, wherein the air holes extend from a bottom surface of the ground ring to an outer side surface of the cover ring.

3. The system as claimed in claim 2, wherein the air holes include:
   a plurality of first air holes in the ground ring; and
   a plurality of second air holes in the cover ring and connected to the first air holes.

4. The system as claimed in claim 3, wherein:
   the wall liner includes an exhausting hole through a bottom portion of the wall liner adjacent to the electrostatic chuck, and
   a density of the first air holes increases with decreasing distance from the exhausting hole.

5. The system as claimed in claim 3, wherein the second air holes include:
   a plurality of first air line holes aligned with the first air holes; and
   a first air gap nozzle connected to the first air line holes and extending towards the outer side surface of the cover ring.

6. The system as claimed in claim 1, wherein the ring member includes:
   a plurality of sectors connected to an upper corner of the side ring.

7. The system as claimed in claim 6, wherein each of the sectors includes:
   an axis on the upper corner of the side ring; and
   a blade coupled to the axis to control an open/close state of the air hole.

8. The system as claimed in claim 1, wherein the side ring includes:
   a first side ring enclosing the outer side surface of the focus ring and the side surface of the electrostatic chuck; and
   a second side ring enclosing an outer side surface of the first side ring and defining the air holes.

9. The system as claimed in claim 8, wherein each of the air holes includes:
   a second air line hole extending from a bottom surface of the second side ring toward a top portion of the second side ring; and
   a second air gap nozzle connected to the second air line hole to extend toward an outer side surface of the second side ring.

10. The system as claimed in claim 1, further comprising:
    a non-reaction gas supplying part connected to a bottom portion of the wall liner to supply a non-reaction gas to the air hole.

11. A substrate processing system with an air hole, comprising:
    a chamber including a lower housing and an upper housing;
    an electrostatic chuck in the lower housing to hold a substrate; and
    a ring structure to enclose a side surface of the electrostatic chuck, wherein the ring structure includes an air hole extending from a bottom to a top of the ring structure and from the top to an outer side surface of the ring structure.

12. The system as claimed in claim 11, wherein the ring structure includes:
    a focus ring on an edge region of the electrostatic chuck; and
    a side ring enclosing an outer side surface of the focus ring and a side surface of the electrostatic chuck and having the air hole.

13. The system as claimed in claim 12, wherein the side ring includes:
    a ground ring enclosing the side surface of the electrostatic chuck; and
    a cover ring on the ground ring to enclose the outer side surface of the focus ring, wherein the air hole includes:
    an air line hole in the ground ring; and
    an air gap nozzle connected to the air line hole and in an outer side surface of the cover ring.

14. The system as claimed in claim 12, wherein:
    the ring structure includes a plurality of sectors on an upper corner of the side ring, each of the sectors including:
    an axis on the upper corner of the side ring; and
    a blade connected to the axis to control an open/close state of the air hole.

15. The system as claimed in claim 12, wherein the side ring includes:
    a first side ring enclosing the outer side surface of the focus ring and the side surface of the electrostatic chuck; and
    a second side ring enclosing an outer side surface of the first side ring and having the air hole.

16. A substrate processing system, comprising:
    a chamber;
    an electrostatic chuck in the chamber to hold a substrate; and
    a ring member on an edge region and a side surface of the electrostatic chuck, wherein the ring member includes:
    a focus ring on the edge region of the electrostatic chuck, and
    a side ring enclosing an outer side surface of the focus ring and the side surface of the electrostatic chuck, and
    an air nozzle extending from a bottom surface of the side ring toward a top portion of the side ring and extending from the top portion of the side ring toward an outer side surface of the side ring member.

17. The system as claimed in claim 16, wherein the side ring includes:
    a ground ring enclosing an entirety of the side surface of the electrostatic chuck; and
    a cover ring on the ground ring to enclose an entirety of the outer side surface of the focus ring, the air nozzle passing through an outer side surface of the cover ring and extending along a perimeter of the cover ring.

18. The system as claimed in claim 17, further comprising:
    a non-reaction gas supplying part connected to the chamber to supply a non-reaction gas to the air nozzle,
    wherein the ground ring includes a plurality of first air line holes spaced apart from each other along a perimeter of the ground ring, the plurality of first air line holes being connected to the air nozzle to provide the non-reaction gas into a region between the air nozzle and the chamber.

19. The system as claimed in claim 18, further comprising:
    a wall liner between the ground ring and the chamber to enclose the electrostatic chuck, wherein the first air line holes are connected to holes penetrating the wall liner.

20. The system as claimed in claim 19, wherein:
    the wall liner has an exhausting hole adjacent to the electrostatic chuck, and
    a density of the first air line holes increases with decreasing distance from the exhausting hole.

* * * * *